United States Patent
Imamiya

(10) Patent No.: US 7,372,735 B2
(45) Date of Patent: *May 13, 2008

(54) NON-VOLATILE SEMICONDUCTOR MEMORY DEVICE

(75) Inventor: Kenichi Imamiya, Tokyo (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 11/769,404

(22) Filed: Jun. 27, 2007

(65) Prior Publication Data

US 2007/0300056 A1     Dec. 27, 2007

Related U.S. Application Data

(60) Division of application No. 11/133,790, filed on May 19, 2005, now Pat. No. 7,307,883, which is a continuation of application No. 10/850,870, filed on May 20, 2004, now Pat. No. 6,903,971, which is a continuation of application No. 10/302,771, filed on Nov. 21, 2002, now Pat. No. 6,760,256.

(30) Foreign Application Priority Data

Nov. 22, 2001   (JP)   ............................. 2001-358327

(51) Int. Cl.
*G11C 11/34* (2006.01)
*G11C 16/04* (2006.01)

(52) U.S. Cl. ........................... 365/185.17; 365/185.33; 365/189.05

(58) Field of Classification Search ........... 365/185.17, 365/185.33, 189.05, 226, 228
See application file for complete search history.

(56) References Cited

U.S. PATENT DOCUMENTS

| 5,379,262 | A | 1/1995 | Okamoto et al. |
| 6,058,048 | A | 5/2000 | Kwon |
| 6,404,676 | B2 | 6/2002 | Kihara et al. |
| 6,462,985 | B2 | 10/2002 | Hosono et al. |
| 6,646,930 | B2 | 11/2003 | Takeuchi et al. |

FOREIGN PATENT DOCUMENTS

| JP | 63-184858 | 7/1988 |
| JP | 10-260908 | 9/1998 |
| JP | 2000-100181 | 4/2000 |

*Primary Examiner*—Anh Phung
*Assistant Examiner*—Toan Le
(74) *Attorney, Agent, or Firm*—Hogan & Hartson LLP

(57) ABSTRACT

A non-volatile semiconductor memory device includes a non-volatile memory element group having a first storage area which stores booting data and a second storage area to store storage addresses of the first storage area. The device further includes a detecting circuit which detects turn-ON of a power supply. The device further includes a register to which the storage address stored in the second storage area is read out and transferred from the non-volatile memory element group when the detecting circuit detects turn-ON of the power supply, and a control circuit which performs a control operation to output booting data stored in the first storage area and corresponding to the storage address transferred to the register after an initialization operation performed at the power supply turn-ON time is terminated.

1 Claim, 11 Drawing Sheets

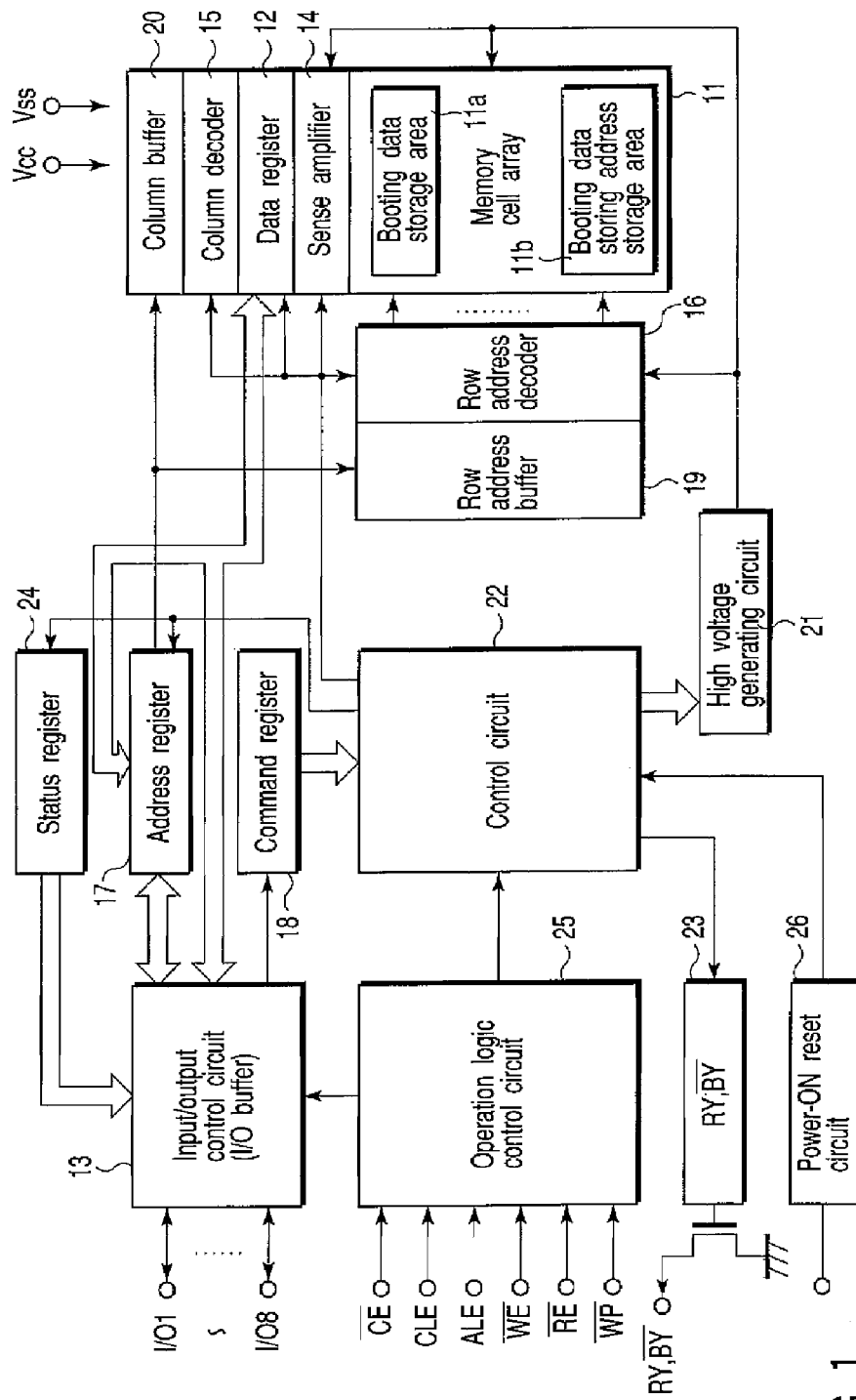
F I G. 1

NON-VOLATILE SEMICONDUCTOR MEMORY DEVICE

This is a divisional of application Ser. No. 11/133,790, flied May 19, 2005, now U.S. Pat. No. 7,307,883, issued Dec. 11, 2007, which is a continuation of application Ser. No. 10/850,870, flied May 20, 2004, now U.S. Pat. No. 6,903,971, issued Jun. 7, 2005, which is a continuation of application Ser. No. 10/302,771, filed Nov. 21, 2002, now U.S. Pat. No. 6,760,256 issued Jul. 6, 2004, which applications are hereby incorporated by reference in their entireties.

CROSS-REFERENCE TO RELATED APPLICATIONS

This application is based upon and claims the benefit of priority from the prior Japanese Patent Application No. 2001-358327, filed Nov. 22, 2001, the entire contents of which are incorporated herein by references.

BACKGROUND OF THE INVENTION

1. Field of the Invention

This invention relates to a non-volatile semiconductor memory device and more particularly to a non-volatile memory (Electrically Erasable Programmable ROM (Read Only Memory)) such as a NAND type flash memory in which data can be electrically rewritten.

2. Description of the Related Art

Conventionally, in a system containing a processor, an instruction which the processor first receives is output from a non-volatile memory such as a mask ROM or flash ROM. In a non-volatile memory which can output data according to the input state of address pins, the processor is only required to input the address to the non-volatile memory at the power supply turn-ON (startup) time. Particularly, in a NAND type flash memory used as the non-volatile memory, for example, an address area on the memory is specified and a plurality of data items are simultaneously reads out from the specified address area. Then, the plurality of readout data items are serially output in response to clock input of a read enable signal (/RE). In this case, "/" indicates an inverted signal (bar) of the corresponding signal for convenience.

FIG. 13 shows a case wherein the NAND type flash memory with the above configuration is used for startup (booting) of the system, for example. When the power supply of the system is turned ON, for example, a processor (not shown) supplies a startup (readout) control signal to a row address decoder 102 and data register 103. When the readout control signal is supplied, data items in a preset address area (in this example, from page "0") on a cell array 101 which is previously determined as a set value of the memory are read out to the data-register 103. The data items read out to the data register 103 are supplied to an input/output (I/O) buffer 104 and then output to the exterior according to clock input of a read enable signal /RE.

As the memory, a preset memory area corresponding to a plurality of successive addresses starting from the "0" address on the cell array 101 is defined as a data area to store system booting data. The memory is so designed that data items in the data area will be successively output in response to an external clock (read enable signal /RE).

However, the NAND type flash memory is normally used as a file storing memory (file memory) Therefore, it is not always preferable to store system booting data in an area corresponding to the "0" address on the cell array 101. This is because there is a possibility that the data area for the system booting data and a data area (file management data storage area) to store file management data of the file memory will conflict with each other.

As described above, in the prior art, the NAND type flash memory can be used to boot the system, but in this case, there occurs a problem that the data area for the system booting data and a file management data storage area may conflict with each other.

BRIEF SUMMARY OF THE INVENTION

According to an aspect of the present invention, there is provided a non-volatile semiconductor memory device comprising a non-volatile memory element group having a second storage area to store storage addresses of a first storage area which stores booting data, a, detecting circuit which detects turn-ON of a power supply, a register to which the storage address stored in the second storage area is read out and transferred from the non-volatile memory element group when the detecting circuit detects turn-ON of the power supply, and a control circuit which performs a control, operation to output booting data stored in the first storage area and corresponding to the storage address transferred to the register when an initialization operation performed at the power supply turn-ON time is terminated.

BRIEF DESCRIPTION OF THE SEVERAL VIEWS OF THE DRAWING

FIG. 1 is a block diagram showing an example of the configuration of a system in which a NAND type flash memory according to one embodiment of the present invention is used for booting;

DETAILED DESCRIPTION OF THE INVENTION

There will now be described embodiments of this invention with reference to the accompanying drawings.

FIG. 1 shows an example of the configuration of a system in which a WAND type flash memory (NAND type EEPROM) according to one embodiment of the present invention is used for booting. In this case, a case wherein a NAND type flash memory is used as a file storing memory (file memory) of the system is explained as an example.

In FIG. 1, a memory cell array 11 is configured by arranging a plurality of non-volatile memory cells (not shown) in which data can be electrically rewritten in a matrix form. Each of the non-volatile memory cells has a MbOS (Metal Oxide Semiconductor) transistor structure with a stacked gate structure in which a floating gate and control gate are stacked on each other.

Further, a booting data storage area (first storage area) 11a on the memory cell array it is defined as a data area in which system booting data is to be written. For example, the system booting data is data to determine the operating condition of the memory at the time of system startup caused by turn-ON of the power supply. The booting data storage area 11a is freely and previously set by the user in an address space other than a preset address space on the memory cell array 11. For example, the address space other than the preset address space is an address area other than an address area in which a file management data storage area of the file memory is provided.

Further, a booting data storing address storage area (second storage area) 11b on the memory cell array 11 is used as a data area to store a top address (start address) of the booting data storage area 11a. The booting data storing address storage area 11b is previously defined at the designing time of a memory chip by use of a specified cell group in an address space other than a preset address space on the memory cell array 11.

Figure 2:
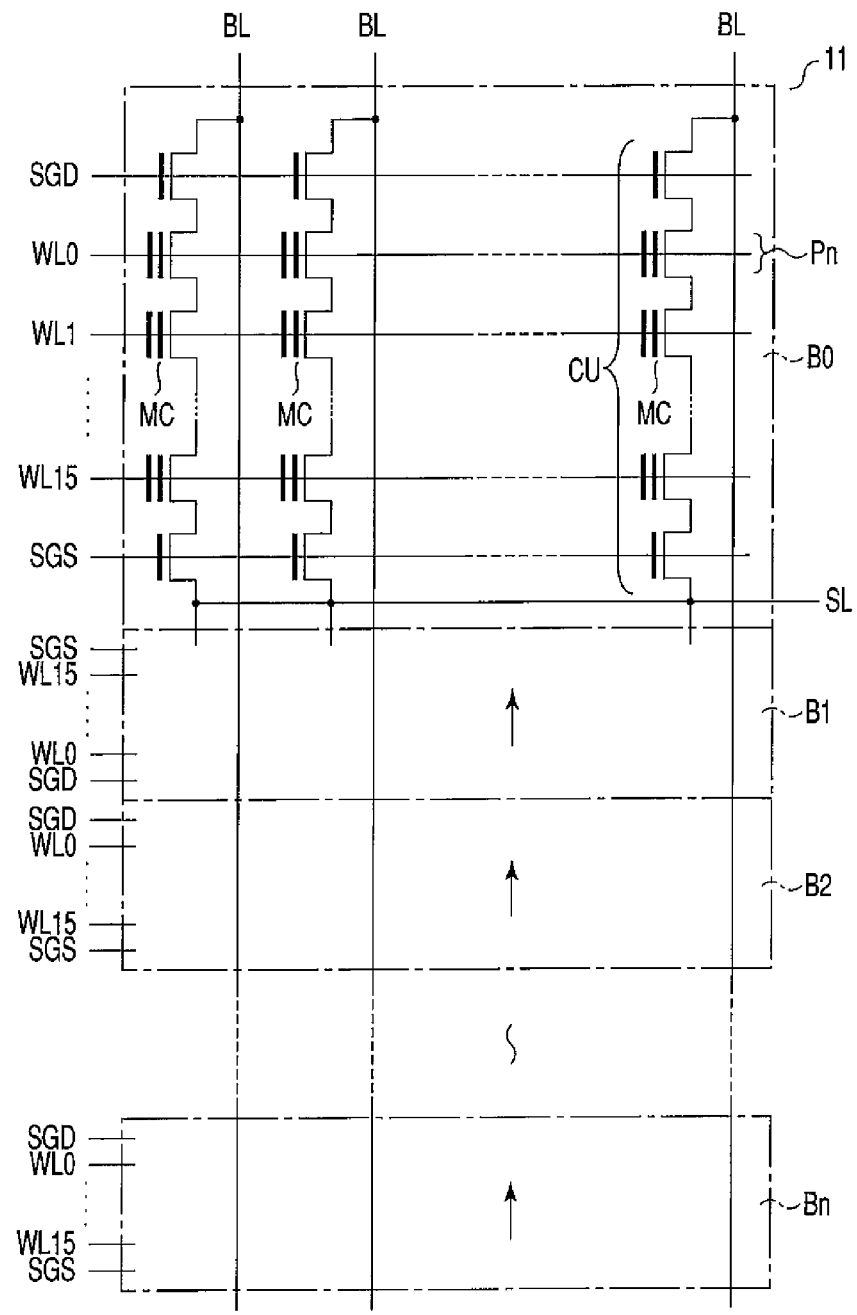
FIG. 2 is a diagram showing an example of the configuration of a memory cell array in the NAND type flash memory of FIG. 1.

FIG. 2 shows an example of the concrete configuration of the memory cell array 11. In this example, each of NAND cell units CU is configured by 16 memory cells MC which are serially connected. A plurality of NAND cell units CU to which word lines WLn (n=0, 1, 2, . . . , 15) are commonly connected configure a corresponding one of cell blocks B0, B1 . . . , Bn which is used as a minimum unit for erase of data. Bit lines BL are commonly connected to a plurality of cell blocks B0, B1 . . . , Bn.

Further, in the NAND type flash memory, a unit including a plurality of column addresses and called a "page" used to simultaneously read out data from a plurality of memory cells MC is provided. To respective pages Pn (n=0, 1, 2, . . . , 15), addresses starting from "0" are sequentially allocated. In the normal operation, the operation for simultaneously reading out data from a plurality of memory cells MC corresponding to a specified page address is performed. Then, the readout data is supplied to an input/output control circuit (I/O buffer) 13 via a data register 12. After this, the data items are output to the exterior in order of the column addresses according to clock input from the exterior.

Figure 3:
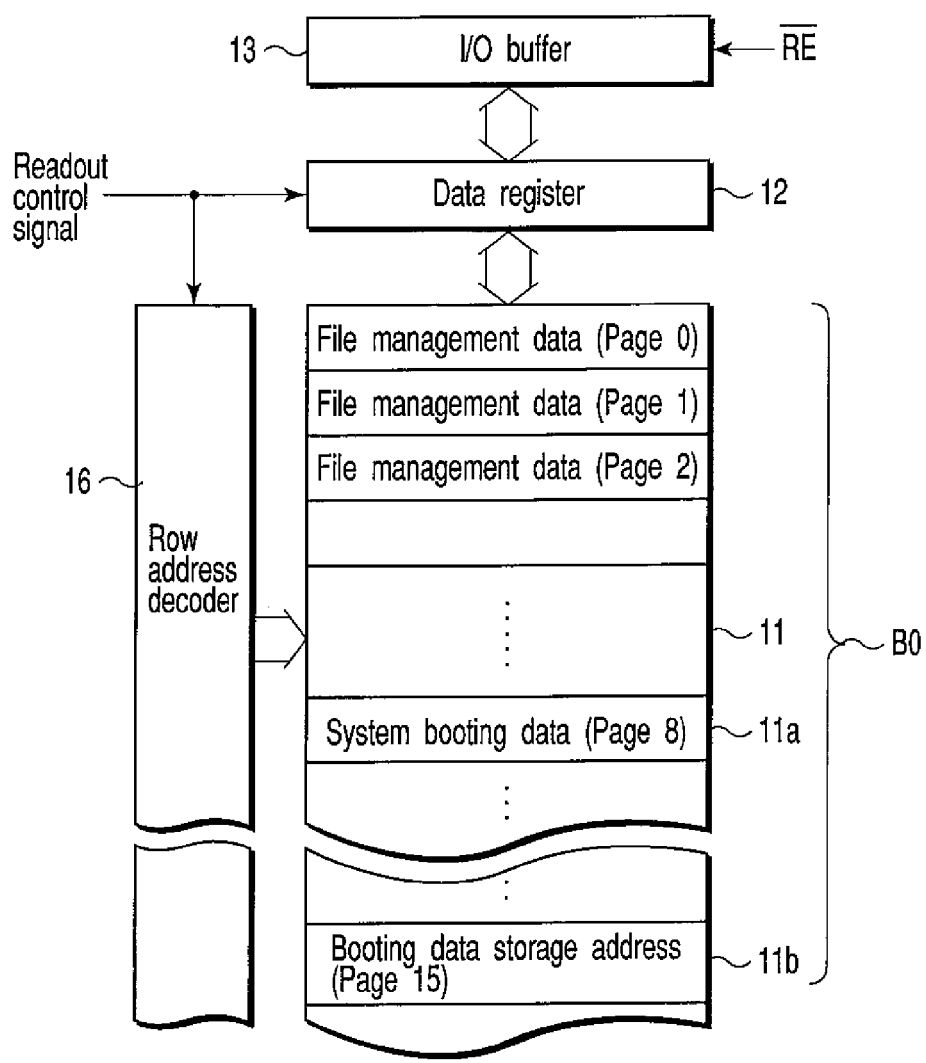
FIG. 3 is a diagram showing one example of data storage in the memory cell array.

As shown in FIG. 3, for example, in the memory cell array 11 with the above configuration, an address area (pages "0" to "2") of the cell block B0 corresponding to page addresses "0" to "2" is defined as a file management data storage area of the file memory. Further, for example, an address area (page "8") of the cell block B0 corresponding to a page address "8" is defined as the booting data storage area 11a by the user. In addition, for example, an address area (page "15") of the cell block B0 corresponding to a page address "15" is previously defined as the booting data storing address storage area 11b.

In the booting data storage area 11a and booting data storing address storage area 11b, the data writing, erasing and readout operations can be performed by selectively driving the bit lines BL and word lines WLn. However, as will be described later, in the normal operation of the NAND type flash memory, access from the exterior is inhibited. That is, data (start address) stored in the booting data storing address storage area 11b is automatically read out and transferred to the data register 12 only at the power supply turn-ON time of the system. The start address stored in the data register 12 is supplied to an address register 17. Then, data in the booting data storage area 11a corresponding to the page address "8", is read out according to a row address and column address generated from the data register 17.

In the NAND type flash memory, the booting data storage area 11a and booting data storing address storage area 11b are provided in part of the memory cell array 11. Therefore, the layout and circuit operation are the same as those of the normal NAND type flash memory and the design thereof is easy.

For example, as shown in FIG. 1, the bit lines BL of the memory cell array 31 are connected to the data register 12 via a sense amplifier 14. In order to select the bit line BL and word sine WLn of the memory, cell array 11, a column decoder 15 and row address decoder 16 are provided.

Input/output ports I/O1 to I/O8 to which address data, command data and write data are input are connected to the I/O buffer 13. Address data input to the I/O buffer 13 is fetched by the address register 17. Further, command data input to the I/O buffer 13 is fetched by a command register 18. In addition, write data input to the I/O buffer 13 is fetched by the data register 12.

A row address generated from the address register 17 is supplied to the row address decoder 16 via a row address buffer 19 and decoded therein. Further, a column address generated from the address register 17 is supplied to the column decoder 15 via a column buffer 20 and decoded therein.

Various high voltages used for data writing and erasing are generated by a high voltage generating circuit 21 configured by a booster circuit. The high voltages from the high voltage generating circuit 21 are supplied to the memory cell array 11, sense amplifier 14 and row address decoder 16.

For example, command data fetched by the command register 18 is supplied to a control circuit 22 and decoded therein. Then, the sequence control process for data writing or erasing is performed by the control circuit 22. That is, the writing operation in the selected memory cell MC and the verify operation to confirm the write state are performed at the data writing time. Then, the control operation is performed to write data again in the memory cell MC into which data has not been sufficiently written. Likewise, the erase operation in the selected cell block B0, B1, . . . , Bn and the verify operation to confirm the erase state are performed at the data erase time. Then, if the erase operation has not been sufficiently performed, the control operation is performed to perform the erase operation again. The control circuit 22 performs the sequence control operation for a series of data writing or erasing operations described above by setting the write mode or erase mode.

Further, the control circuit 22 controls the address register 17, high voltage generating circuit 21, row address decoder 16, sense amplifier 14, data register 12, column decoder 15, ready/busy buffer (RY, /BY) 23 and status register 24. An output of the status register 24 is supplied to the I/O buffer 13.

The ready/busy buffer 23 outputs a ready/busy signal (RY, /BY)="L" (busy state) to inform the exterior that access is inhibited until the initialization process is terminated at the time of system startup caused by turn-ON of the power supply.

Various control signals from the exterior, for example, a chip enable signal /CE, command latch enable signal CLE, address latch enable signal ALE, write enable signal /WE, read enable signal /RE and write protect signal /WP are input to an operation logic control circuit 25. An output of the operation logic control circuit 25 is supplied to the I/O buffer 13 and control circuit 22.

A power-ON reset circuit 26 detects turn-ON of the power supply and outputs a detection signal to the control circuit 22.

In this case, assume that setting of the booting data storage area 11a by writing system booting data into the memory cell array 11 is made by inputting a specified command (setting a booting address mode), for example, at the initialization time of the system or the like.

Figure 4:
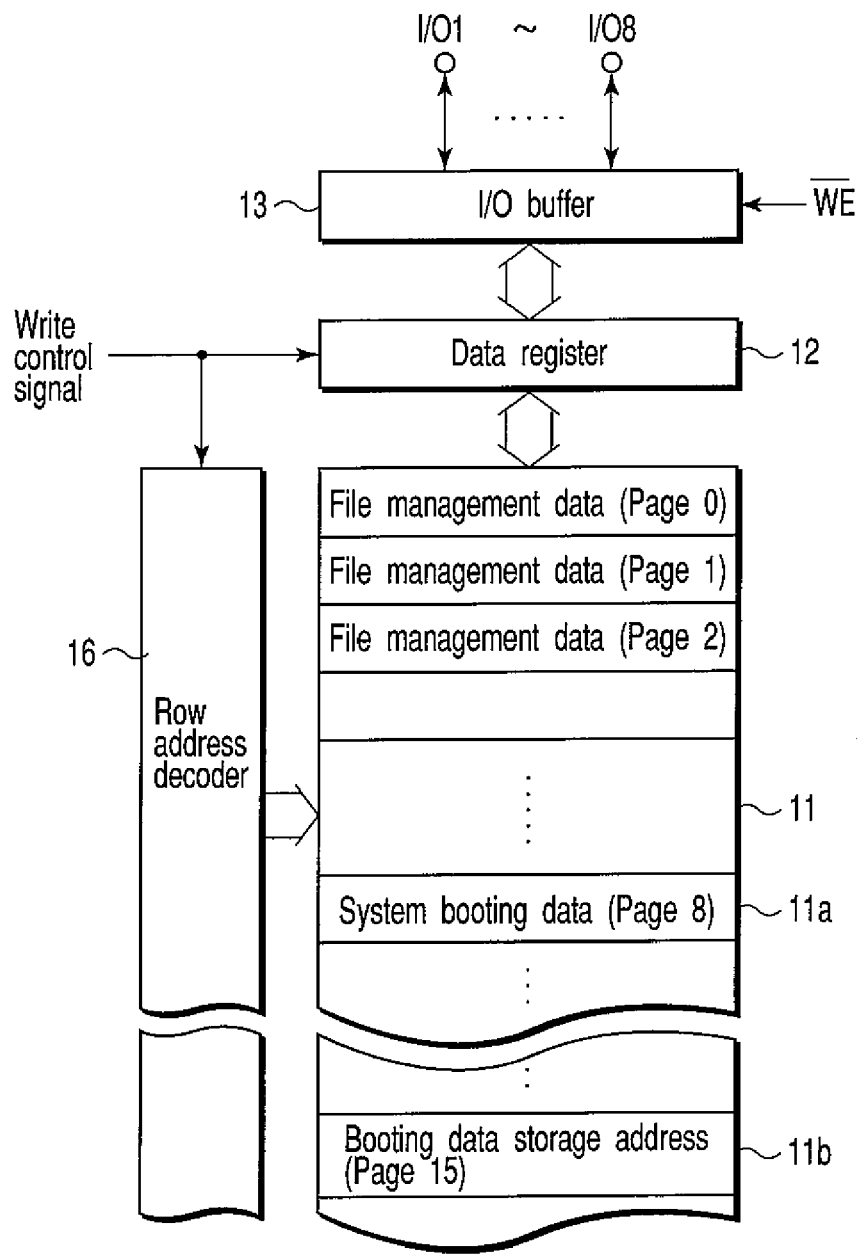
FIG. 4 is a diagram for illustrating a system booting data writing operation in the memory cell array.

That is, only when specified command data is input, the control circuit 22 controls the address register 17. Then, it causes an internal address (in this example, page address "8") required for setting the booting data storage area 11a to be generated in response to address data input via the I/O buffer 13. In this case, command data to set the booting address mode, address data multiplexed by plural times (for example, three times) and command data to set writing (write mode) of data into the memory cell array 11 are input via the input/output ports I/O1 to I/O8. Thus, as shown in FIG. 4, for example, it becomes possible to set the page address of system booting data written into a desired address area (page "8") on the memory cell array 11 by the user as the booting data storage area 11a. Further, the internal address generated by inputting the specified command data is automatically written into the booting data storing address storage area 11b on the memory cell array 11 under control of the control circuit 22.

Thus, it becomes possible to set an address area (page "8") of system booting data arbitrarily written on the memory cell array 11 by the user as the booting data storage area 11a by inputting the specified command data. As a result, the user can freely set the booting data storage area 11a on the memory cell array 11. Therefore, when the NAND type flash memory is used to boot the system, it will not conflict with the file management data storage area of the file memory and the degree of freedom of the system design can be extremely enhanced.

In the present embodiment, the operation timing of a general NAND type flash memory (for example, TC58512FT made by TOSHIBA) which is used as the file memory is explained below.

Figure 5:
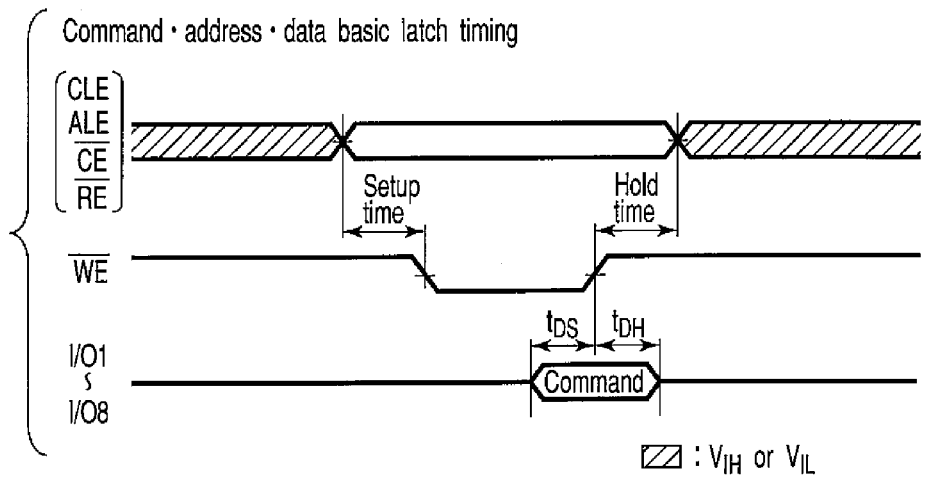
FIG. 5 is a timing chart showing command•address•data basic latch timing of a general NAND type flash memory.

FIG. 5 shows command•address•data basic latch timing (pin input state) of the general NAND type flash memory. In FIG. 5, CLE indicates a command latch enable signal, ALE an address latch enable signal, /CE a chip enable signal, /RE a read enable signal, /WE a write enable signal, and I/O1 to I/O8 input signals of the address•data•command input/output ports. Further, $t_{DS}$ indicates data setup time, $t_{DH}$ indicates data hold time, $V_{IH}$ indicates high level input voltage, and $V_{IL}$ indicates low level input voltage.

Figure 6:
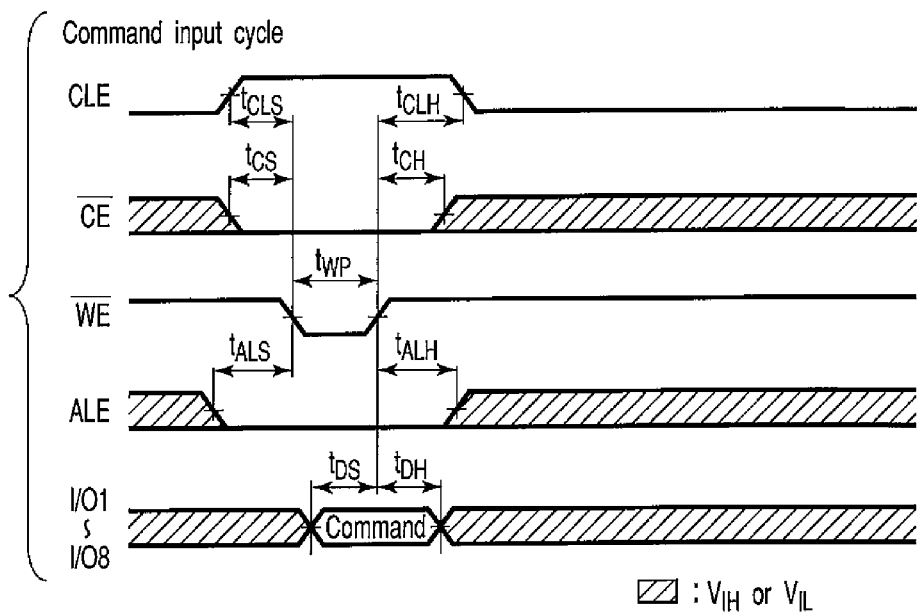
FIG. 6 is a timing chart showing a command input cycle of a general NAND type flash memory.

FIG. 6 shows a command input cycle, (pin input state) of the general NAND type flash memory. In FIG. 6, CLE indicates a command latch enable signal, ALE an address latch enable signal, /CE a chip enable signal, /WE a write enable signal, and I/O1 to I/O8 input signals of the address•data•command input/output ports. Further, $t_{DS}$ indicates data setup time, $t_{DH}$ data hold time, $t_{CLS}$ CLE setup time, $t_{CLH}$ CLE hold time, $t_{CS}$ /CE setup time, $t_{CH}$ /CE hold time, $t_{ALS}$ ALE setup time, $t_{ALH}$ ALE hold time, $t_{WP}$ write pulse width, $V_{IH}$ high level input voltage, and $V_{IL}$ low level input voltage.

Figure 7:
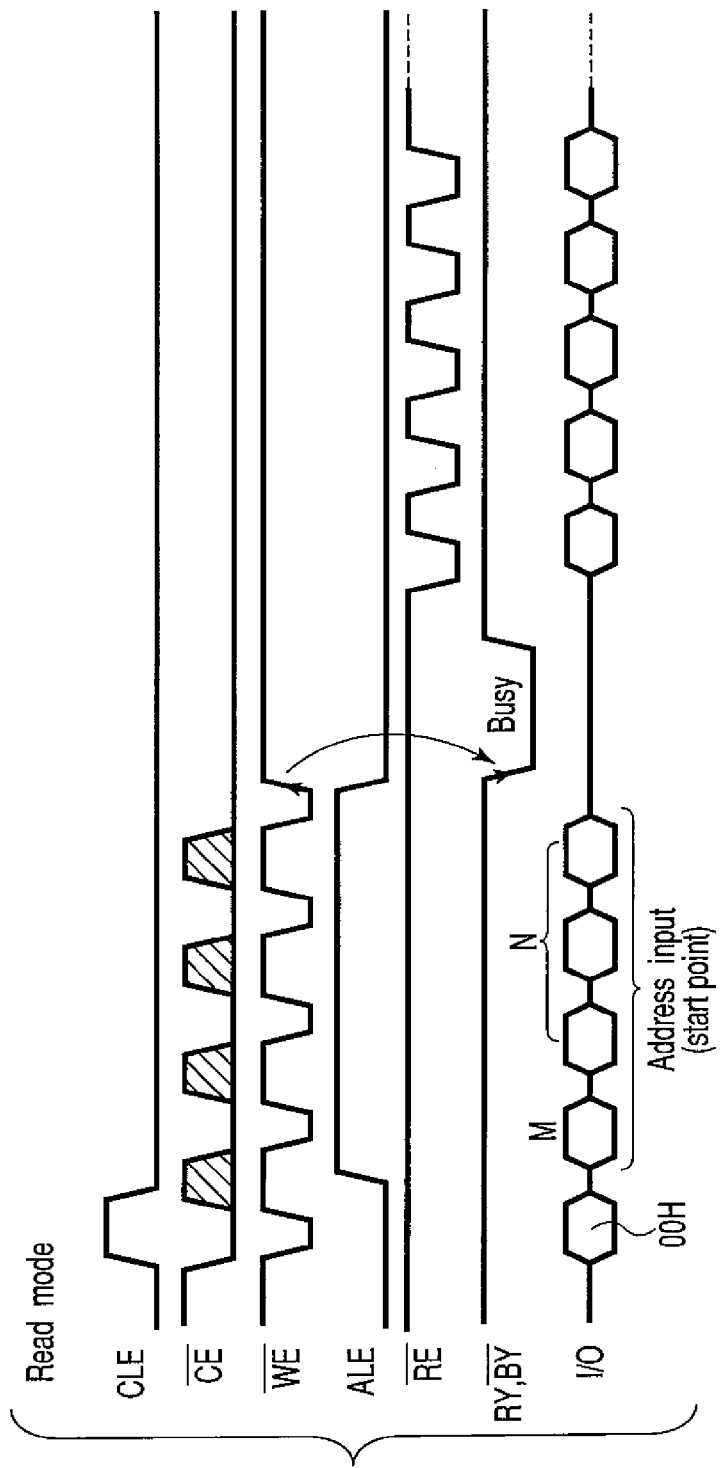
FIG. 7 is a timing chart showing operation timing in the read mode of a general NAND type flash memory.

FIG. 7 shows operation timing (pin input state) in the read mode of the general NAND type flash memory. In FIG. 7, CLE indicates a command latch enable signal, ALE an address latch enable signal, /CE a chip enable signal, /RE a read enable signal, /WE a write enable signal, and I/O an input signal of the address•data•command input/output port. Further, RY, /BY indicates a ready/busy signal.

In order to set the read mode, command data "00H" is used. The busy state is automatically set at the rise of the fourth-cycle write enable signal (/WE) of the address input cycle. As a result, data transfer from the memory cell array 11 to the data register 12 is started. After the data transfer is terminated and the ready state is set, a read enable signal (/RE) is input. Then, data is serially output starting from a start point specified in the address input cycle. The chip enable signal (/CE) is fixed at the low level after the fourth cycle of the address input and while the ready/busy signal (RY, /BY="L") is being output.

Figure 8:
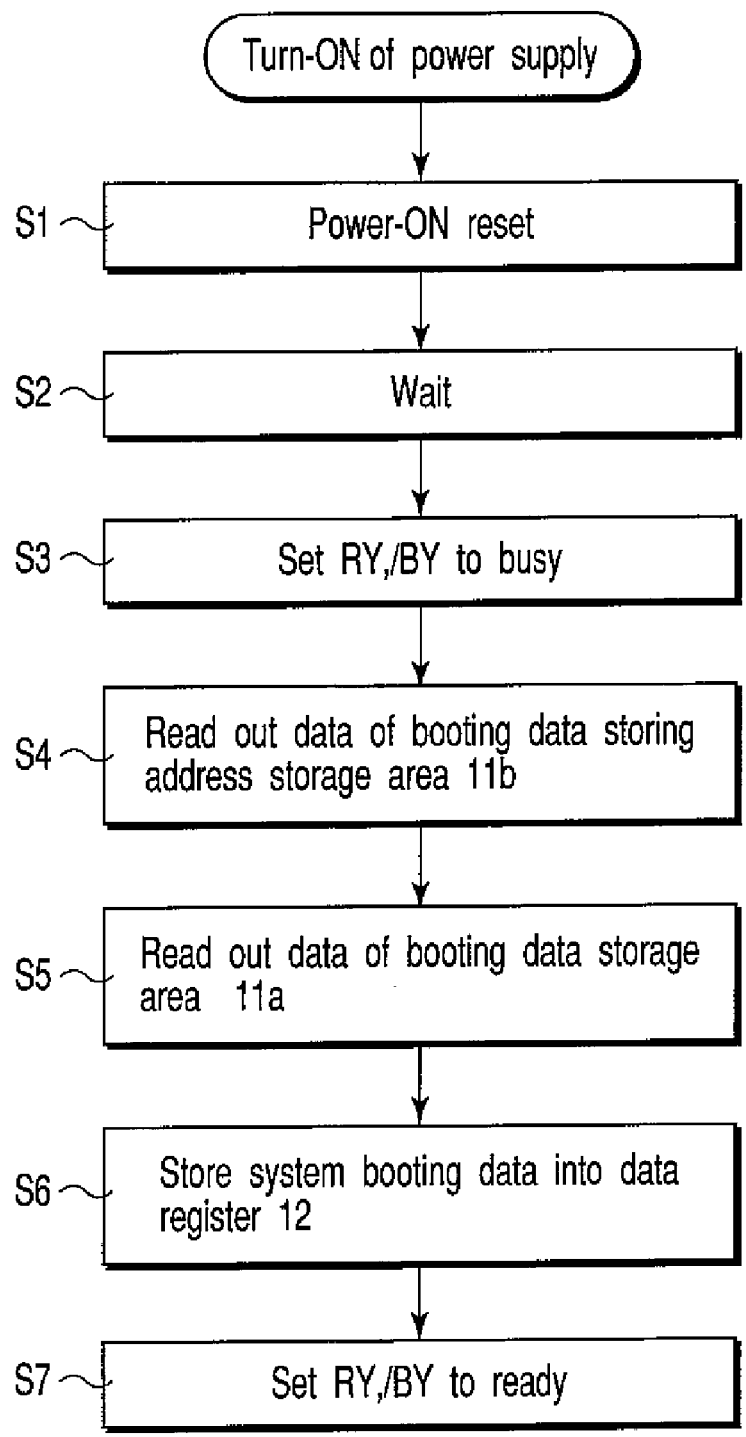
FIG. 8 is a flowchart showing the flow of an operation at the power supply turn-ON time of the system shown in FIG. 1.

FIG. 8 shows the flow of an operation at the power supply turn-ON time of the system in which the NAND type flash memory with the above configuration is used for booting. First, the power supply of the system is turned ON. Then, the power-ON reset circuit 26 is operated to reset the power-ON state (step S1). The control circuit 22 detects the power supply turn-ON state and controls the high voltage generating circuit 21. After a preset period of waiting time which is set to stabilize the power supply has elapsed (step S2), the read mode is set. Further, it controls the ready/busy buffer 23 to set the ready/busy signal to the busy state(="L") (step S3).

In this state, the control circuit 22 causes the address register 17 to generate an internal address which is used to perform the preset initializing operation. Then, it reads out data of an area corresponding to the internal address from the memory cell array 11 and performs a series of initializing operations. In this case, various types of the initializing operations are proposed and the detail explanation thereof is omitted here.

Figure 9:
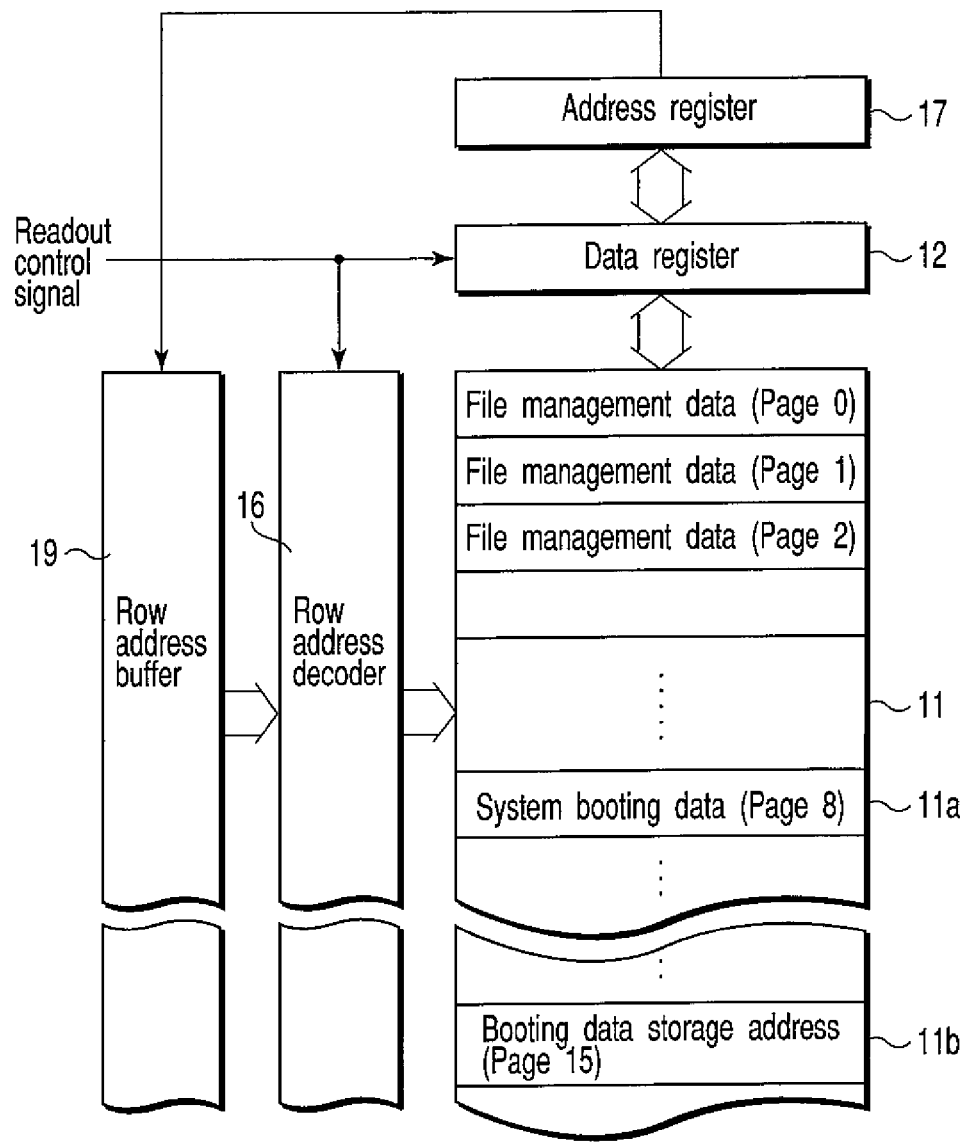
FIG. 9 is a diagram for illustrating an operation for reading out system booting data from the memory cell array.

During the initializing operation, as shown in FIG. 9, for example, the control circuit 22 reads out data from the booting data storing address storage area 11b of the memory cell array 11 which is previously defined (step S4). Then, it transfers the data (start address of the booting data storage area 11a) read out from the booting data storing address storage area 11b to the data register 12.

Further, it transfers the start address stored in the address register 12 to the address register 17. Then, it reads out data of the booting data storage area 11a which corresponds to the page address (in this example, page "8") according to a row address and column address generated from the address register 17 (step S5).

Next, the control circuit 22 transfers the data (system booting data) read out from the booting data storage area 11a to the data register 12 (step S6). In this way, the system booting data is stored into the data register 12 by the time the initialization operation is terminated.

After this, if a series of initializing operations are all terminated, the ready/busy signal is set to the ready state (standby state="H") (step S7). Further, as shown in FIG. 3, for example, the system booting data stored in the data register 12 is output to the exterior according to clock input of the read enable signal (/RE).

Thus, the system booting data stored in the page address which is previously set by the user is read out and set into the data register 12 at the power supply turn-ON time. As a result, like the normal operation, system booting data which is fixed data can be output to the exterior according only to clock input of the read enable signal (/RE) after the power supply is turned ON.

The present invention is not limited to the above embodiment. For example, as the data register, a register having a scale larger than the page length can be used.

Figure 10:
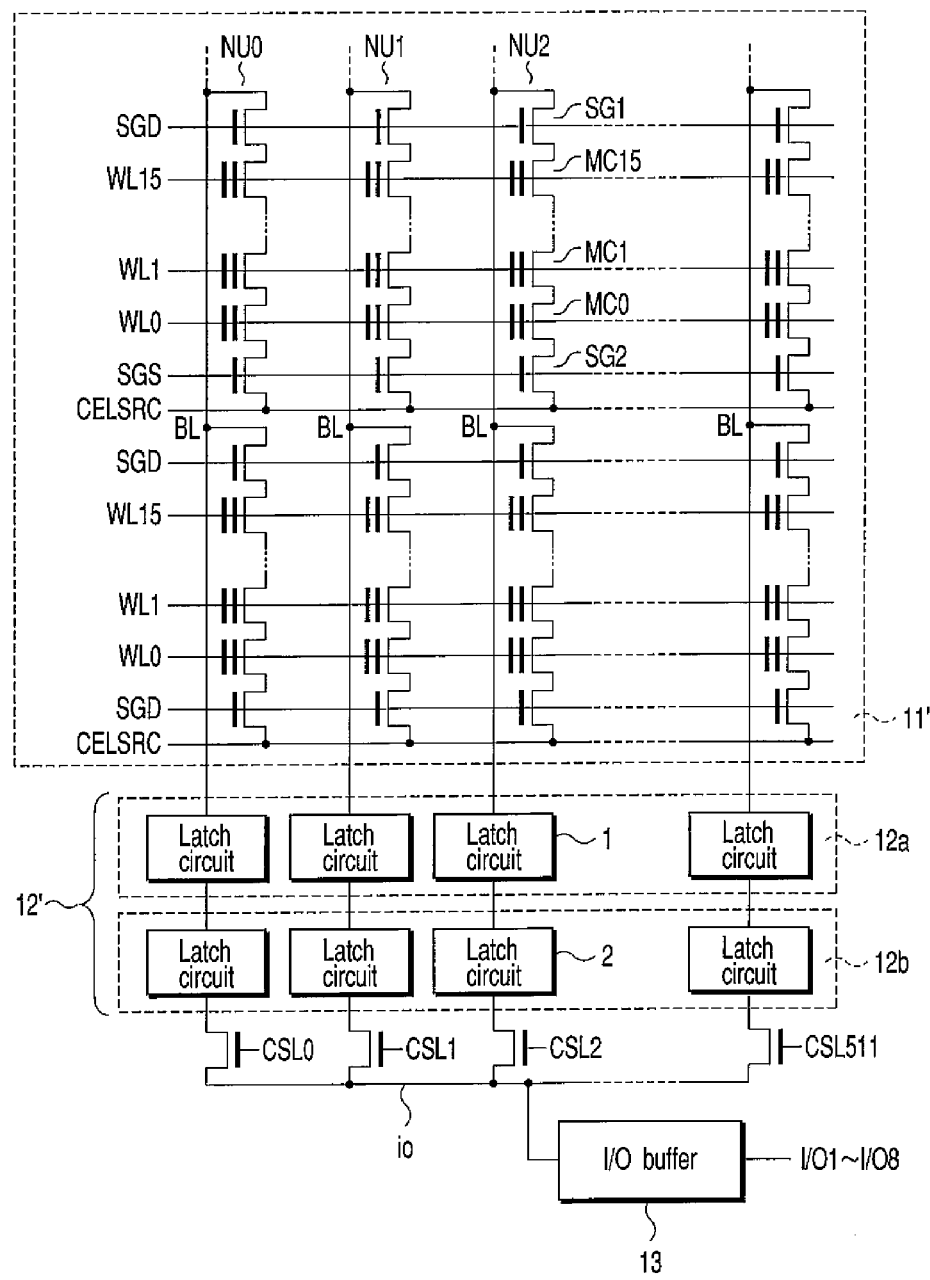
FIG. 10 is a configuration diagram showing a main portion of a system in which a NAND type flash memory according to another embodiment of the present invention is used for booting.

FIG. 10 shows a case wherein a data register having a scale larger than the page length is used. In this example, a case wherein one data register is configured by two registers each having a scale substantially equal to the page length is explained.

In this example, a memory cell array 11' has a page unit which corresponds to the number of bit lines BL which are selectively connected to a data register 12' at the data write operation time or data readout operation time. In FIG. 10, the range of the cell array in which input/output of data is performed with respect to one input/output port (I/O) is shown.

In FIG. 10, data transfer is performed between the input/output ports I/O1 to I/O8 and the data register 12' via the I/O buffer 13. Further, an internal control signal generated from the operation logic control circuit 25 is latched by the I/O buffer 13 and used to control data transfer or the like. The internal control signal is generated in each of operation modes when an external control signal such as the command latch enable signal CLE, address latch enable signal ALE, chip enable signal /CE, read enable signal /RE or write enable signal /WE is fetched by the operation logic control circuit 25.

In the present embodiment, the data register 12' is configured to selectively switch and perform the multi-value operation function and cache function. That is, when binary data of one bit is stored in one memory cell MCn (0, 1, 2, . . . , 15), the cache function is performed. On the other hand, when four-value data of two bits is stored in one-memory cell, the multi-value function is performed or the cache function can be made effective although it is limited by the address.

The data register 12' is configured by first and second registers 12*a* and 12*b* each having substantially the same scale as the page length of each memory cell MCn (0, 1, 2, . . . , 15). The first register 12*a* is configured by a plurality of latch circuits 1 which are provided for the respective bit lines BL. The second register 12*b* is configured by a plurality of latch circuits 2 which are provided for the respective bit lines BL. The first register 12*a* is mainly used at the data readout time or write operation time. The second register 12*b* is used as a secondary latch circuit which realizes the cache function in the binary operation. If the cache function is not used, it auxiliary contributes to the operation of the first register 12*a* to realize the multi-value operation.

Figure 11:
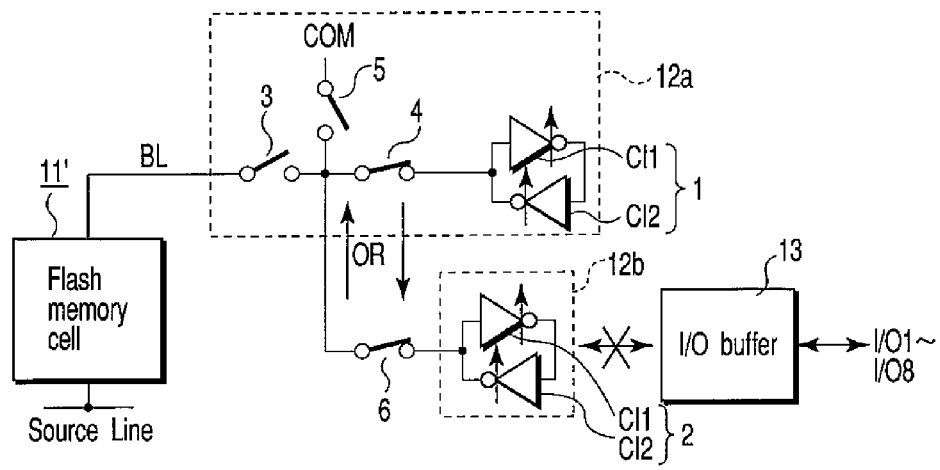
FIG. 11 is a diagram showing one example of the operation of a data register of the system shown in FIG. 10.

For example, as shown in FIG. 11, one of the latch circuits 1 of the first register 12*a* is configured by connecting clocked inverters CI1, CI2 in an anti-parallel fashion. Each bit line BL of the memory cell array 11' is connected to a sense node via an NMOS transistor 3 which is a transfer switching element. Further, the sense node is connected to a data hold node of the latch circuit 1 via an NMOS transistor 4 which is a transfer switching element. To the sense node, a precharge NMOS transistor (not shown) is connected.

A common signal line COM is commonly arranged for the data register 12' of every one byte for each column. The common signal line COM is-connected to the sense node via an NMOS transistor 5 which is a transfer switching element. The common signal line COM is used as a Vdd power supply line which is used to selectively charge the sense node. Further, it is used as a signal line which is used to make pass/fail determination in the data write or erase verify operation.

Like the latch circuit 1, one of the latch circuits 2 is configured by connecting clocked inverters CI1, CI2 in an anti-parallel fashion. One of data hold nodes of the latch circuit 2 is connected to the sense node of the first register 12*a* via an NMOS transistor 6 which is a transfer switching element.

As shown in FIG. 10, in the connection relation between the data register 12' and the I/O buffer 13, the processing unit in the data readout operation or data write operation of the NAND type flash memory is set to 512 bytes equal to the capacity of one page simultaneously selected by one row address. The number of the input/output ports I/O1 to I/O8 is eight. Therefore, 512 bits are allocated for each input/output port I/O. That is in the case of FIG. 10, the configuration of 512 bits is shown.

When data is written into the memory cell MCn, write data from the data signal line i0 is fetched into the latch circuit 2 of the second register 12*b*. In order to start the data write operation, the write data is required to exist in the latch circuit of the first register 12*a*. Therefore, it is necessary to transfer data held in the latch circuit 2 to the latch circuit 1. Further, in the data readout operation, in order to output data to the input/output ports I/O1 to I/O8, the readout data is required to exist in the latch circuit 2. Therefore, it becomes necessary to transfer data read out to and set in the latch circuit 1 to the latch circuit 2. Accordingly, as shown in FIG. 11, the switching elements 4, 6 are set in the conductive state so as to permit data to be transferred between the latch circuits 1 and 2. At this time, data is transferred after the latch circuit which is a transfer destination is set in the non-active state and then the latch circuit which is the transfer destination is restored to the active state to hold the data.

Figure 12:
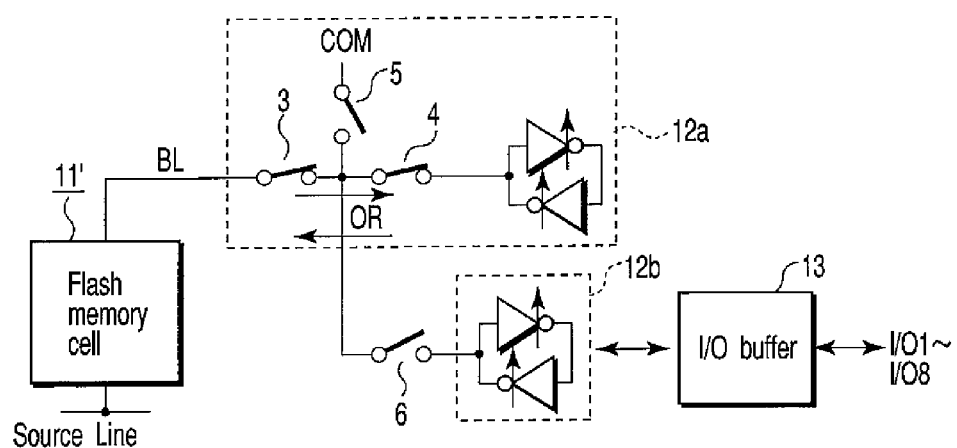
FIG. 12 is a diagram showing another example of the operation of the data register of the system shown in FIG. 10.
Figure 13:
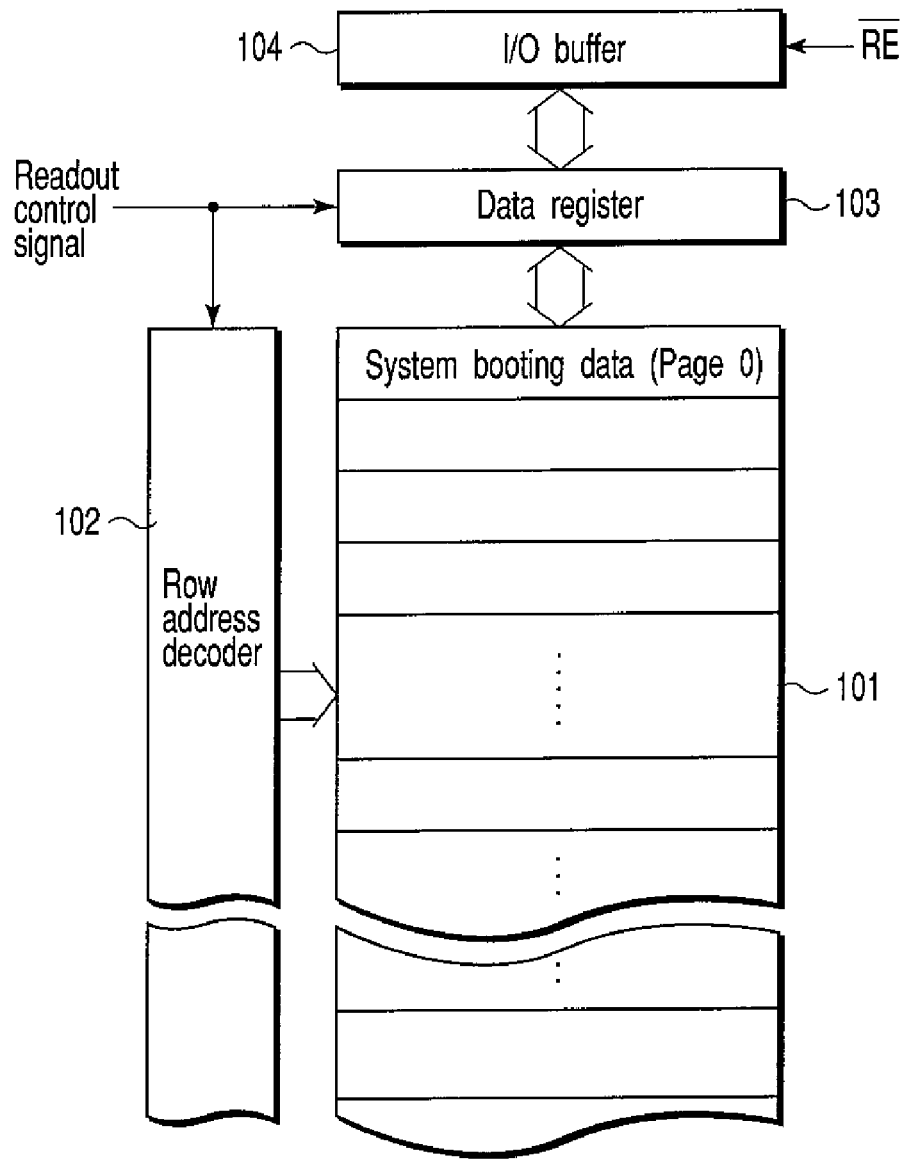
FIG. 13 is a diagram showing a case wherein a NAND type flash memory is used for startup (booting) of a system as an example, for illustrating the prior art technique and the problem thereof.

As shown in FIG. 12, for example, the operation for controlling the data write operation into the memory cell MCn and the operation for controlling the data readout operation from the memory cell MCn are normally performed by use of the first register 12*a* containing the latch circuits 1 except a case of the multi-value operation. At this time, the switching element 6 is held in the nonconductive state and the switching elements 3, 4 are set in the conductive state. As a result, data can be transferred between the latch circuit 1 and the bit line BL of the memory cell array 11'.

Thus, the data register 12' is configured by the first, second registers 12*a*, 12*b* each having substantially the same scale as the page length of the memory cell. In this case, it becomes possible to read out data from the memory cell MCn and set the same into the latch circuit 1 of the first register 12*a* after data has been transferred to the latch circuit 2 of the second register 12*b* at the data readout operation time.

Therefore, system booting data of capacity larger than the page size can be output by successively reading out data of plural pages by use of the same clock.

As described above, system booting data which is fixed data can be output simply by use of clock input at the power supply turn-ON time. That is, the start address of the booting data storage area which is used to store system booting data and arbitrarily set by the user is stored in the booting data storing address storage area which is previously defined. As a result, the system booting data stored in the address area which is previously set by the user can be automatically read out and transferred to the register at the power supply turn-ON time and then the data can be output according to the external clock after turn-ON of the power supply. Therefore, the storage area used to store the system booting data can be freely set on the memory cell array by the user and the degree of freedom of the system design can be extremely enhanced.

Further, the system booting data output operation at the time of turn-ON of the power supply can be contained in the initialization operation by use of output of the ready/busy signal (RY, /BY). Therefore, the memory of the-present embodiment can be used in the same manner as the conventional memory.

Further, in a normal memory in which an address is designated by use of address pins, it is possible to output data (which does not necessarily exist in an address space of the normal memory) of a desired address area on the memory which is different from the address designated by the pins as a special operation at the power supply turn-ON time.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A non-volatile semiconductor memory device comprising:
    a non-volatile memory cell array having a first storage area and a second storage area, the first storage area storing booting data, and the second storage area storing an address of the first storage area;
    a data register coupled to the non-volatile memory cell array;
    a detecting circuit to generate a detection signal indicating turn-on of a power supply;
    an address register, coupled to the data register, capable of storing the address of the first storage area; and
    a control circuit, in response to the detection signal, to cause the address of the first storage area to be stored in the address register.

* * * * *